United States Patent
Ting et al.

(10) Patent No.: US 9,466,355 B2
(45) Date of Patent: Oct. 11, 2016

(54) MEMORY ARCHITECTURE DIVIDING MEMORY CELL ARRAY INTO INDEPENDENT MEMORY BANKS

(71) Applicant: Piecemakers Technology, Inc., Hsinchu (TW)

(72) Inventors: Tah-Kang Joseph Ting, Taipei (TW); Gyh-Bin Wang, Hsinchu County (TW)

(73) Assignee: Piecemakers Technology, Inc., Hsinchu (TW)

( * ) Notice: Subject to any disclaimer, the term of this patent is extended or adjusted under 35 U.S.C. 154(b) by 0 days.

(21) Appl. No.: 14/711,782

(22) Filed: May 14, 2015

(65) Prior Publication Data

US 2015/0332751 A1 Nov. 19, 2015

(30) Foreign Application Priority Data

May 19, 2014 (TW) .............................. 103117529 A

(51) Int. Cl.
| | |
|---|---|
| G11C 8/10 | (2006.01) |
| G11C 11/408 | (2006.01) |
| G11C 5/02 | (2006.01) |
| G11C 8/12 | (2006.01) |

(52) U.S. Cl.
CPC ........... *G11C 11/4087* (2013.01); *G11C 5/025* (2013.01); *G11C 8/10* (2013.01); *G11C 8/12* (2013.01); *G11C 11/4085* (2013.01)

(58) Field of Classification Search
CPC ...................................................... G11C 8/10
USPC .................................................... 365/230.06
See application file for complete search history.

(56) References Cited

U.S. PATENT DOCUMENTS

| | | | | |
|---|---|---|---|---|
| 5,140,550 | A * | 8/1992 | Miyaoka ................. | G11C 8/14 365/177 |
| 5,511,027 | A * | 4/1996 | Shimizu .................. | G11C 8/08 365/189.09 |
| 5,910,927 | A * | 6/1999 | Hamamoto ............. | G11C 7/065 365/185.05 |
| 5,970,016 | A * | 10/1999 | Ohsawa .................. | G11C 7/06 365/189.05 |
| 5,986,966 | A * | 11/1999 | Nagata .................... | G11C 8/08 365/230.03 |
| 6,011,746 | A * | 1/2000 | Oh .......................... | G11C 8/08 365/189.11 |
| 6,125,076 | A * | 9/2000 | Ishikawa ................ | G11C 8/14 365/230.03 |
| 6,347,052 | B1* | 2/2002 | Akaogi ................... | G11C 16/08 365/185.23 |
| 7,046,550 | B1 | 5/2006 | Reohr | |
| 7,282,987 | B2 | 10/2007 | Lee | |
| 7,436,690 | B2 | 10/2008 | Chen | |
| 7,548,108 | B2* | 6/2009 | Choi ....................... | G11O 5/14 326/112 |

* cited by examiner

*Primary Examiner* — Son Mai

(74) *Attorney, Agent, or Firm* — Winston Hsu; Scott Margo

(57) ABSTRACT

A memory architecture includes K first wordlines, M groups of second wordlines, a memory cell array and M switch circuits. K and M are positive integers. Each group of second wordlines includes a plurality of second wordlines. The memory cell array includes M memory banks. The M memory banks are coupled to the M groups of second wordlines respectively, and receive independent M sets of second wordline signals through the M groups of second wordlines respectively. M switch circuits are disposed in correspondence with the M memory banks respectively. Each switch circuit selectively couples the K first wordlines to a corresponding memory bank so that the corresponding memory bank receives a shared set of first wordline signals through the K first wordline. Each memory bank performs a data access operation according to the received set of first wordline signals and a corresponding set of second wordline signals.

19 Claims, 6 Drawing Sheets

MEMORY ARCHITECTURE DIVIDING MEMORY CELL ARRAY INTO INDEPENDENT MEMORY BANKS

BACKGROUND OF THE INVENTION

1. Field of the Invention

The disclosed embodiments of the present invention relate to memory, and more particularly, to a memory architecture which divides a memory cell array into a plurality of memory banks operating independently of each other.

2. Description of the Prior Art

In order to implement a layout of high density memory cells, a dynamic random access memory (DRAM) needs sufficient row transition time (row cycle time (tRC), which is usually longer than 30 ns). However, the row transition time greatly affects random access cycle time of the DRAM.

One conventional method is to employ an architecture having multiple sets of banks, wherein the architecture can select respective word lines of different banks in parallel and access data of different banks in sequence. However, as different banks need respective word line decoding circuits and respective control circuits, the architecture having multiple sets of banks causes increased areas and costs of memory dies.

SUMMARY OF THE INVENTION

It is therefore one objective of the present invention to provide a circuit architecture and a latch-type local wordline drive circuit so that memories can share a global word line decoding circuit, thus greatly reducing influence of memory die areas to realize an architecture having multiple independent sets of memory banks.

According to an embodiment of the present invention, an exemplary memory architecture is disclosed. The exemplary memory architecture comprises K first wordlines (e.g. global wordlines), M groups of second wordlines and a memory cell array. K and M are positive integers. Each of the M groups of second wordlines comprises a plurality of second wordlines. The memory cell array comprises M memory banks. Each of the M memory banks comprises a plurality of memory cells arranged in rows and columns. Each of the M memory banks is coupled to the K first wordlines, while the M memory banks are coupled to the M groups of second wordlines respectively. The M memory banks receive a shared set of first wordline signals through the K first wordlines, and receive independent M sets of second wordline signals through the M groups of second wordlines respectively. Each of the M memory banks performs a data access operation according to the received set of first wordline signals and a corresponding set of second wordline signals.

In one implementation, the exemplary memory architecture further comprises M switch circuits. The M switch circuits are disposed in correspondence with the M memory banks respectively. Each of the M switch circuits selectively couples the K first wordlines to a corresponding memory bank so that the corresponding memory bank receives the shared set of first wordline signals through the K first wordlines.

The proposed memory architecture may provide a plurality of memory banks (a single memory cell array can include a plurality of memory banks) and implement seamless read/write operations by employing a latch-type wordline drive circuit, thereby achieving high bandwidth data access and high speed random access.

These and other objectives of the present invention will no doubt become obvious to those of ordinary skill in the art after reading the following detailed description of the preferred embodiment that is illustrated in the various figures and drawings.

DETAILED DESCRIPTION

By dividing a memory cell array into a plurality of memory banks, which operate independently of each other, and employing a hierarchical wordline structure, the proposed memory architecture may provide high speed and flexible data access mechanism. Further description is provided below.

Figure 1:
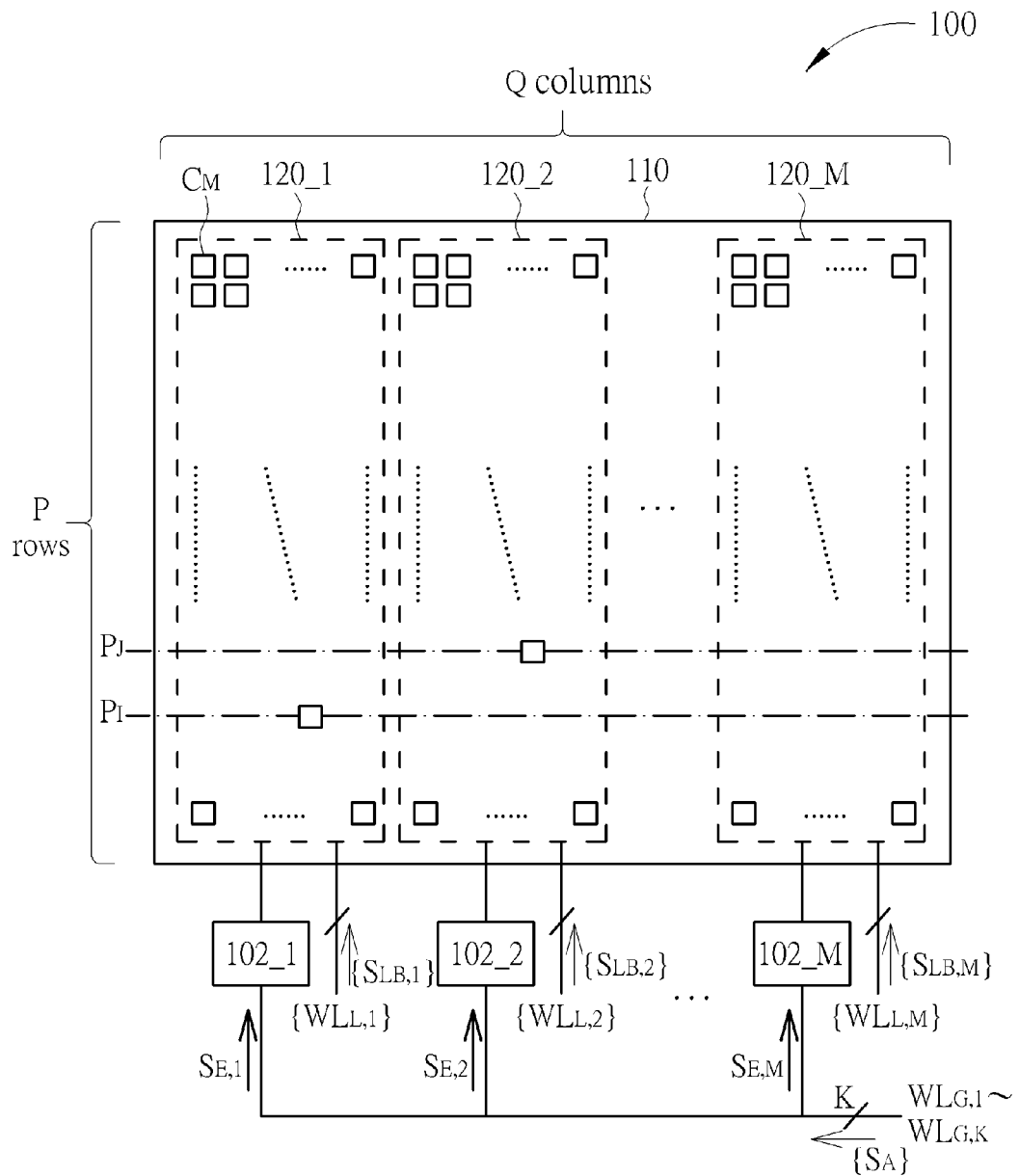
FIG. 1 is a diagram illustrating an exemplary memory architecture according to an embodiment of the present invention.

Please refer to FIG. 1, which is a diagram illustrating an exemplary memory architecture according to an embodiment of the present invention. The memory architecture 100 may include, but is not limited to, a memory cell array 110 which includes a plurality of memory cells arranged in P rows and Q columns (P and Q are positive integers), wherein each memory cell is labeled $C_M$. Each memory cell may be disposed in correspondence with an intersection of a row and a column. By way of example but not limitation, each memory cell may be a one-transistor one-capacitor (1T1C) memory cell. The memory cell array 110 may further include M memory banks 120_1-120_M (M is a positive integer), wherein each of the memory banks 120_1-120_M includes a plurality of memory cells arranged in rows and columns. In other words, the memory cell array 110 may be divided into the memory banks 120_1-120_M, wherein each memory bank may include a portion of the memory cells included in the memory cell array 110.

Please note that the memory banks 120_1-120_M may operate independently of each other. Specifically, the memory banks 120_1-120_M may perform access operations according to respective address information. In practice, the memory architecture 100 may further include M switch circuits 102_1-102_M, K first wordlines $WL_{G,1}$-$WL_{G,K}$ (K is a positive integer) and M groups of second wordlines $\{WL_{L,1}\}$-$\{WL_{L,M}\}$, wherein the switch circuits 102_1-102_M are disposed in correspondence with the memory banks 120_1-120_M respectively, and each of the groups of second wordlines $\{WL_{L,1}\}$-$\{WL_{L,M}\}$ includes a plurality of second wordlines.

Each of the switch circuits 102_1-102_M may selectively couple the K first wordlines $WL_{G,1}$-$WL_{G,K}$ to a corresponding memory bank so that the corresponding memory bank may receive a shared set of first wordline signals $\{S_A\}$ through the K first wordlines $WL_{G,1}$-$WL_{G,K}$. For example, the switch circuits 102_1-102_M may be controlled by M enable signals $S_{E,1}$-$S_{E,M}$ respectively. When the switch circuit 102_1 is turned on according to the enable signal $S_{E,1}$, the memory bank 120_1 may receive the set of first wordline signals {$S_A$} through the K first wordlines $WL_{G,1}$-$WL_{G,K}$. The memory banks 120_1-120_M are coupled to the groups of second wordlines {$WL_{L,1}$}-{$WL_{L,M}$} respectively, and may receive independent M sets of second wordline signals {$S_{LB,1}$}-{$S_{LB,M}$} through the groups of second wordlines {$WL_{L,1}$}-{$WL_{L,M}$} respectively. In brief, each of the memory banks 120_1-120_M is coupled to the first wordlines $WL_{G,1}$-$WL_{G,K}$ when a corresponding switch circuit (one of the M switch circuits 102_1-102_M) is turned on, while the memory banks 120_1-120_M are coupled to the groups of second wordlines {$WL_{L,1}$}-{$WL_{L,M}$} respectively. Accordingly, each of the memory banks 120_1-120_M may perform a data access operation according to the received set of first wordline signals {$S_A$} and a corresponding set of second wordline signals (one of the sets of second wordline signals {$S_{LB,1}$}-{$S_{LB,M}$}).

For example, in a case where a peripheral circuit of the memory architecture 100 (not shown in FIG. 1) performs data access operations upon a memory cell of the memory bank 120_1 (corresponding to a row $P_I$ of the P rows) and a memory cell of the memory bank 120_2 (corresponding to a row $P_J$ of the P rows) in sequence, after the memory bank 120_1 activates the row $P_I$ according to the enable signal $S_{E,1}$, the set of first wordline signals {$S_A$} and the set of second wordline signals {$S_{LB,1}$}, the memory bank 120_2 may activate the row $P_J$ according to the enable signal $S_{E,2}$, the set of first wordline signals {$S_A$} and the set of second wordline signals {$S_{LB,2}$} without waiting for the completion of charge sharing, data sensing, data write-back, wordline closing and precharge operations of the memory bank 120_1. In other words, the proposed memory architecture may eliminate/decrease waiting time of switching between different rows, thus providing high bandwidth and short time delay data transmission. In addition, as the proposed memory architecture may rapidly switch between different memory banks included in the same memory cell array, the proposed memory architecture may set a shorter burst length to provide faster random access speed to thereby realize a seamless read/write operation.

In this embodiment, the K first wordlines $WL_{G,1}$-$WL_{G,K}$ may be used as global wordlines, and arranged for transmitting a plurality of first wordline signals $S_{A,1}$-$S_{A,K}$ included in the set of first wordline signals {$S_A$}. The M groups of second wordlines {$WL_{L,1}$}-{$WL_{L,M}$} may be used as local wordlines, wherein a plurality of second wordlines included in each group of second wordlines may be arranged for transmitting a plurality of second wordline signals included in the set of second wordline signals {$S_{LB,i}$} (i is a positive integer greater than 1 and smaller than or equal to M), respectively. In other words, the memory architecture 100 may have a hierarchical wordline structure, thus reducing an area occupied by a peripheral circuit of the memory cell array 110. However, the above is for illustrative purposes only, and is not meant to be a limitation of the present invention. In an alternative design, any two of the M memory bank 120_1-120_M have no shared wordlines. In other words, each memory bank performs a data access operation according to a corresponding enable signal and wordline signals received through individual wordlines. In brief, any alternatives or modifications associated with a memory cell array, which employs a structure having a plurality of memory banks operating independently of each other, fall within the spirit and scope of the present invention.

Figure 2:
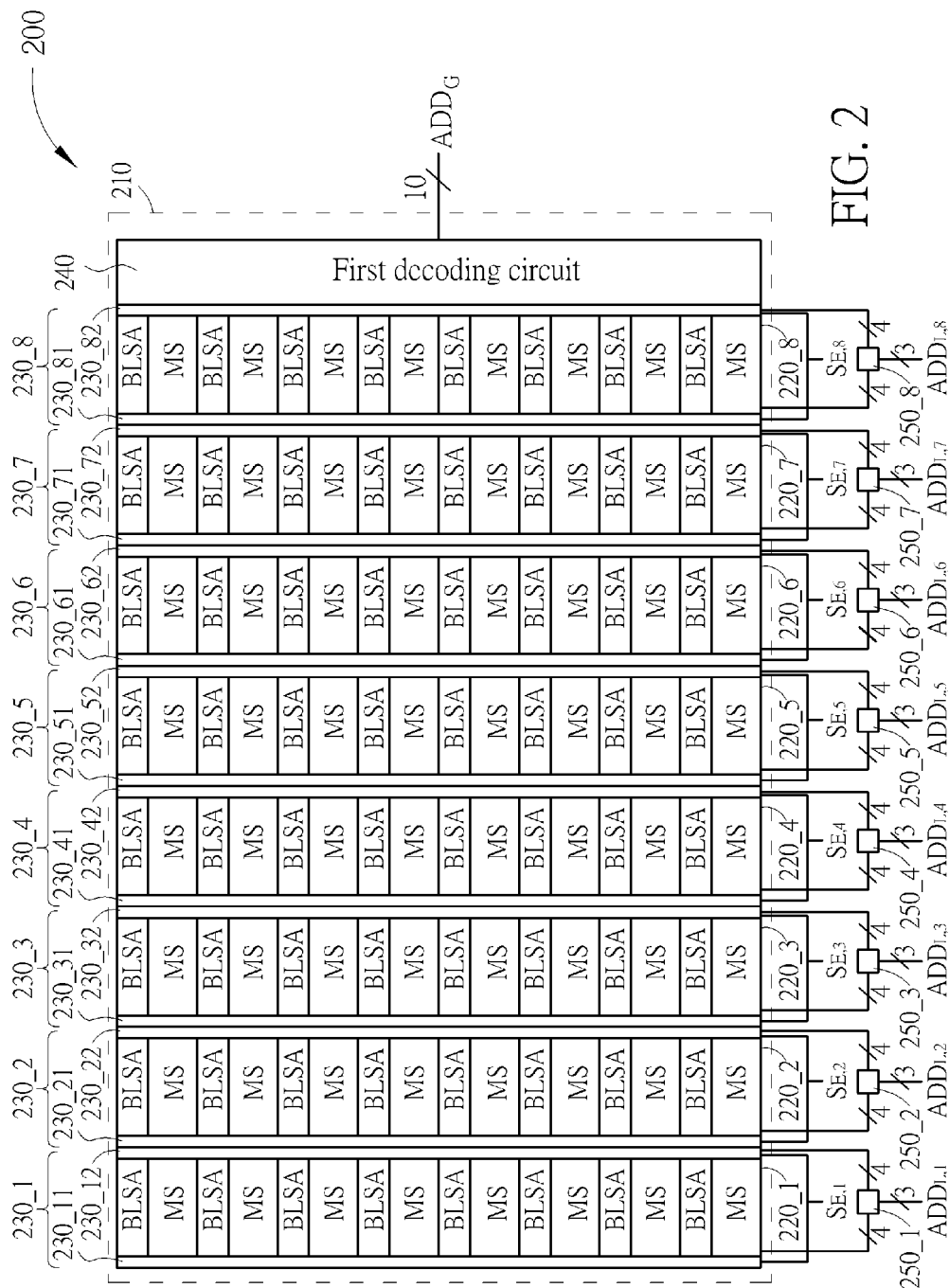
FIG. 2 is an implementation of the memory architecture shown in FIG. 1.
Figure 3:
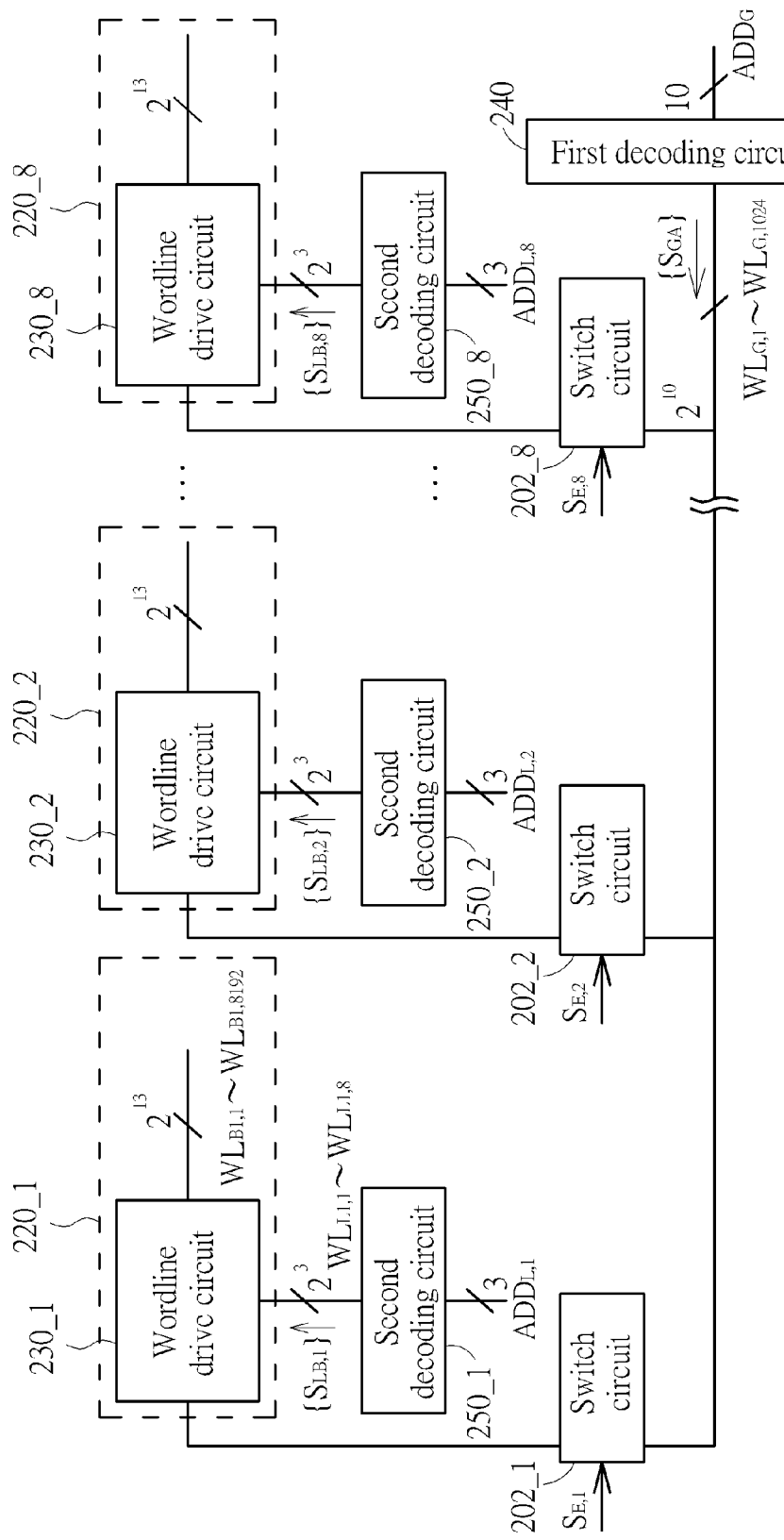
FIG. 3 is a diagram illustrating a hierarchical wordline configuration employed in the memory architecture shown in FIG. 2.

In order to facilitate an understanding of the proposed memory architecture, an exemplary implementation of a memory architecture employing hierarchical wordlines is given below. One skilled in the art should understand that this is not meant to be a limitation of the present invention. Please refer to FIG. 2 and FIG. 3 together. FIG. 2 is an implementation of the memory architecture 100 shown in FIG. 1, and FIG. 3 is a diagram illustrating a hierarchical wordline configuration employed in the memory architecture 200 shown in FIG. 2. The memory architecture 200 may include a plurality of first wordlines $WL_{G,1}$-$WL_{G,1024}$, a plurality of groups of second wordlines {$WL_{L,1}$}-{$WL_{L,8}$}, a memory cell array 210, a plurality of switch circuits 202_1-202_8 (as shown in FIG. 3), a first decoding circuit 240 and a plurality of second decoding circuits 250_1-250_8, wherein each group of second wordlines may have L second wordlines ($L=2^3$ in this implementation). The memory cell array 110, the M switch circuits 102_1-102_M, the K first wordlines $WL_{G,1}$-$WL_{G,K}$ and the M groups of second wordlines {$WL_{L,1}$}-{$WL_{L,M}$} shown in FIG. 1 may be implemented by the memory cell array 210, the switch circuits 202_1-202_8, the first wordlines $WL_{G,1}$-$WL_{G,1024}$ and the groups of second wordlines {$WL_{L,1}$}-{$WL_{L,8}$} (i.e. $K=2^{10}$ and M=8).

The memory cell array 210 may include a plurality memory banks 220_1-220_8, wherein each memory bank may include a plurality of memory cells arranged in rows and columns (not shown in FIG. 2), a wordline drive circuit (i.e. one of a plurality of wordline drive circuits 230_1-230_8) and a plurality of bit line sense amplifiers BLSA. Each memory bank further include T third wordlines ($T=2^{13}$ in this implementation), which may be disposed in correspondence with the rows of the memory bank respectively. Hence, the wordline drive circuit of the memory bank may activate the rows through the T third wordlines. Operations of the wordline drive circuits 230_1-230_8 will be described later.

In this implementation, each memory bank may be divided into a plurality of memory sections MS, and the bit line sense amplifier BLSA may be disposed between corresponding memory sections. As a person skilled in the art should understand operations of the memory section and the bit line sense amplifier, further description is omitted here for brevity.

The first decoding circuit 240 may be coupled to the memory banks 220_1-220_8 through the first wordlines $WL_{G,1}$-$WL_{G,1024}$, and arranged for decoding a first wordline address $ADD_G$ (ten bits) to generate a set of first wordline signals {$S_{GA}$}, wherein a plurality of first wordline signals $S_{GA,1}$-$S_{GA,1024}$ included in the set of first wordline signals {$S_{GA}$} may be transmitted to each of the wordline drive circuits 230_1-230_8 through the first wordlines $WL_{G,1}$-$WL_{G,1024}$ according to the enable signals $S_{E,1}$-$S_{E,8}$. The second decoding circuit 250_1-250_8 may be coupled to the memory banks 220_1-220_8 through the groups of second wordlines {$WL_{L,1}$}-{$WL_{L,8}$} respectively, wherein each second decoding circuit may be arranged for decoding a second wordline address (one of a plurality of second wordline address $ADD_{L,1}$-$ADD_{L,8}$; each second wordline address has three bits) to generate a set of second wordline signals (one of a plurality of sets of second wordline signals {$S_{LB,1}$}-{$S_{LB,8}$}). The generated set of second wordline signals may be transmitted to a corresponding memory bank (or a wordline drive circuit) through a corresponding group of second wordlines.

For example, the wordline drive circuit 230_1 of the memory bank 220_1 is coupled to a plurality of second wordlines $WL_{L1,1}$-$WL_{L1,8}$ and a plurality of third wordlines $W_{LB1,1}$-$W_{LB1,8192}$, and is further coupled to the first wordlines $WL_{G,1}$-$WL_{G,1024}$ when the switch circuit 202_1 couples the first wordlines $WL_{G,1}$-$WL_{G,1024}$ to the memory bank 220_1 according to the enable signal $S_{E,1}$. Hence, the wordline drive circuit 230_1 may enable the third wordlines $WL_{B1,1}$-$WL_{B1,8192}$ according to the received set of first wordline signals $\{S_{GA}\}$ and the set of second wordline signals $\{S_{LB,1}\}$ in order to access the memory cells of the memory bank 220_1 through the third wordlines $WL_{B1,1}$-$WL_{B1,8192}$. It should be noted that each wordline drive circuit may be implemented by a latch-type drive circuit. Accordingly, after the wordline drive circuit 230_1 drives the memory bank 220_1, another wordline drive circuit (one of the wordline drive circuits 230_2-230_8) may drive a corresponding memory bank without waiting for the completion of charge sharing, data sensing, data write-back, wordline closing and precharge operations of the memory bank 220_1, wherein before the another wordline drive circuit drives the corresponding memory bank, the switch circuit 202_1 may be turned off to prevent current memory access from being affected by updated wordline address information provided for another memory bank. In other words, even though the set of first wordline signals $\{S_{GA}\}$ changes in response to a different wordline address, the wordline drive circuit 230_1 may maintain an activation state of the third wordlines $WL_{B1,1}$-$WL_{B1,8192}$.

Figure 4:
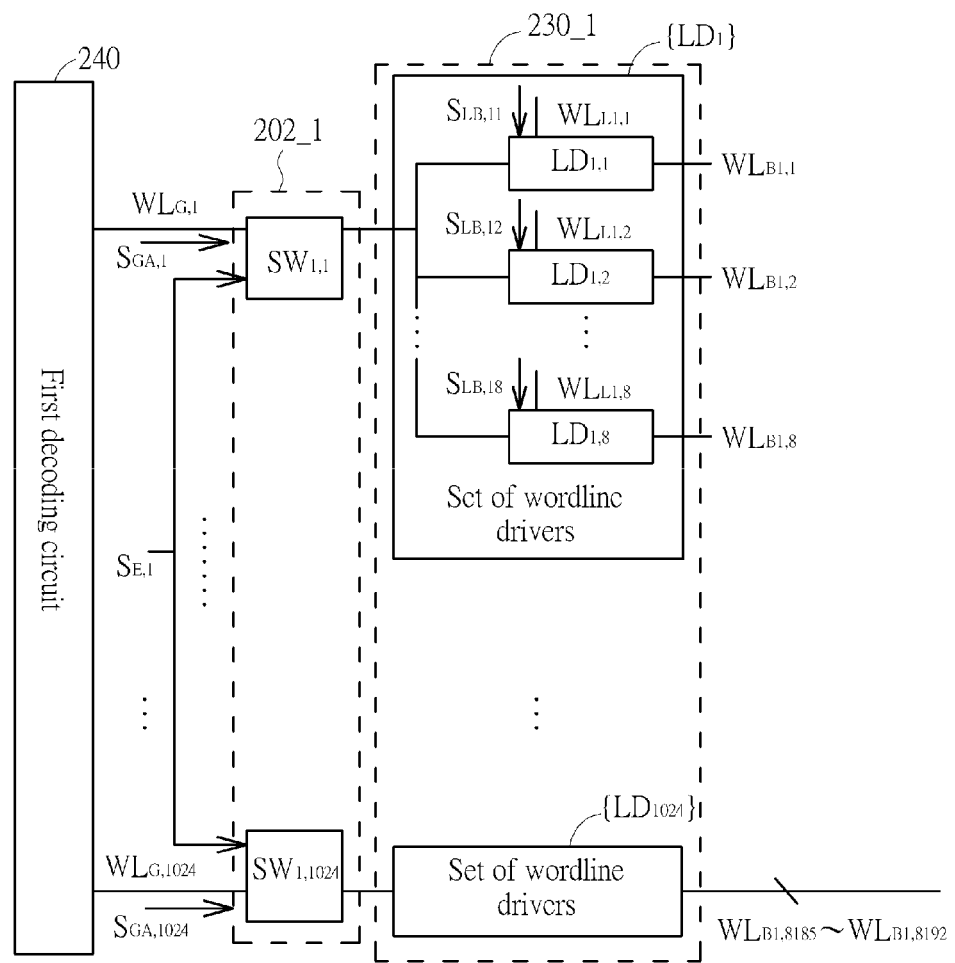
FIG. 4 is an implementation of the wordline drive circuit shown in FIG. 3.

Please refer to FIG. 4, which is an implementation of the wordline drive circuit 230_1 shown in FIG. 3. The wordline drive circuit 230_1 may include a plurality of sets of wordline drivers $\{LD_1\}$-$\{LD_{1024}\}$, which are respectively coupled to the first wordlines $WL_{G,1}$-$WL_{G,1024}$ when the memory bank 220_1 is coupled to the first wordlines $WL_{G,1}$-$WL_{G,1024}$ according to the enable signal $S_{E,1}$. In this implementation, the switch circuit 202_1 may selectively couple the first wordlines $WL_{G,1}$-$WL_{G,1024}$ to the sets of wordline drivers $\{LD_1\}$-$\{LD_{1024}\}$ respectively. Specifically, the switch circuit 202_1 may include a plurality of switches $SW_{1,1}$-$SW_{1,1024}$ and the switches $SW_{1,1}$-$SW_{1,1024}$ may disposed in correspondence with the first wordlines $WL_{G,1}$-$WL_{G,1024}$ respectively. Hence, each of the switches $SW_{1,1}$-$SW_{1,1024}$ may selectively couples a first wordline to a corresponding set of wordline drivers according to the enable signal $S_{E,1}$.

Each set of wordline drivers $\{LD_1\}$-$\{LD_{1024}\}$ may include a plurality of wordline drivers, and each of the wordline drivers are coupled to a first wordline corresponding to the set of wordline drivers when the memory bank 220_1 is coupled to the first wordline (e.g. the enable signal $S_{E,1}$ is in a predetermined state). Additionally, the wordline drivers are coupled to the second wordlines $WL_{L1,1}$-$WL_{L1,8}$ (which are coupled to the wordline drive circuit 230_1) respectively, and are coupled to corresponding third wordlines (within the third wordlines $WL_{B1,1}$-$WL_{B1,8192}$) respectively. For example, the set of wordline drivers $\{LD_1\}$ may include a plurality of wordline drivers $LD_{1,1}$-$LD_{1,8}$, wherein each of the wordline drivers $LD_{1,1}$-$LD_{1,8}$ is coupled to a first wordline $WL_{G,1}$ when the enable signal $S_{E,1}$ has a high signal level to turn on the switch $SW_{1,1}$, and the wordline drives $LD_{1,1}$-$LD_{1,8}$ are coupled to the second wordlines $WL_{L1,1}$-$WL_{L1,8}$ respectively. The wordline drivers $LD_{1,1}$-$LD_{1,8}$ are further coupled to a plurality of third wordlines $WL_{B1,1}$-$WL_{B1,8}$ respectively so as to drive the respective rows.

By way of example but not limitation, each set of wordline drivers may have the same number of wordline drivers in this implementation. Hence, respective third wordlines coupled to the sets of wordline drivers may have the same number of wordlines. For example, the set of wordline drivers $\{LD_{1024}\}$ may be coupled to the third wordlines $WL_{B1,8185}$-$WL_{B1,8192}$. Additionally, the set of first wordline signals $\{S_{GA}\}$ shown in FIG. 3 may include a plurality of first wordline signals $S_{GA,1}$-$S_{GA,1024}$ respectively transmitted through the first wordlines $WL_{G,1}$-$WL_{G,1024}$, and the set of second wordline signals $\{S_{LB,1}\}$ shown in FIG. 3 may include a plurality of second wordline signals $S_{LB,11}$-$S_{LB,18}$ respectively transmitted through the second wordlines $WL_{L1,1}$-$WL_{L1,8}$.

It should be noted that a portion of wordline drivers within each set of wordline drivers may be disposed on one side of a corresponding memory bank in a column direction, and another portion of the wordline drivers within the set of wordline drivers may be disposed on another side of the corresponding memory bank in the column direction. Please refer to FIG. 2 and FIG. 4 together. Regarding the memory bank 220_1, wordline drivers coupled to a portion of the second wordlines $WL_{L1,1}$-$WL_{L1,8}$ (e.g. the second wordlines $WL_{L1,1}$-$WL_{L1,4}$) may be disposed on one side of the memory bank 220_1 in the column direction, and wordline drivers coupled to another portion of the second wordlines $WL_{L1,1}$-$WL_{L1,8}$ (e.g. the second wordlines $WL_{L1,5}$-$WL_{L1,4}$) may be disposed on another side of the memory bank 220_1 in the column direction. In other words, the wordline drive circuit 230_1 may include a wordline drive circuit 230_11 and a wordline drive circuit 230_12 which are disposed on different sides of the memory bank 220_1.

In this implementation, the switch circuits 202_2-202_8 may be implemented by the structure of the switch circuit 202_1 shown in FIG. 4, and/or the wordline drive circuits 230_2-230_8 may be implemented by the aforementioned structure (e.g. a wordline drive circuit 230_21/230_31/230_41/230_51/230_61/230_71/230_81 disposed on one side of a corresponding memory bank, and a wordline drive circuit 230_22/230_32/230_42/230_52/230_62/230_72/230_82 disposed on another side of the corresponding memory bank). However, this is for illustrative purposes only, and is not meant to be a limitation of the present invention. For example, different numbers of wordline drivers may be employed on two sides of a memory bank (i.e. respective second wordlines disposed on two sides of a corresponding memory bank may have different numbers of wordlines). In another example, all of the wordline drives included in the same set of wordline drivers may be disposed on a certain side of a corresponding memory bank. In still another example, all of the wordline drivers of a wordline drive circuit may be disposed on a certain side of a corresponding memory bank.

In one implementation, each wordline driver within the sets of wordline drivers $\{LD_1\}$-$\{LD_{1024}\}$ may be implemented by a latch-type driver. Please refer to FIG. 5, which is a diagram illustrating an implementation of the wordline driver $LD_{1,1}$ shown in FIG. 4. In this implementation, the wordline driver $LD_{1,1}$ may include a plurality of transistors M1-M3 and an inverter INV. The transistor M1 has a control terminal $N_{C1}$, a connection terminal $N_{N11}$ and a connection terminal $N_{N12}$, wherein the control terminal $N_{C1}$ is coupled to the third wordline $WL_{B1,1}$, the connection terminal $N_{N11}$ is coupled to the first wordline $WL_{G,1}$ through the switch $SW_{1,1}$ to receive an inverting signal $S_{GA,1}'$ of the first wordline signal $S_{GA,1}$ (e.g. coupling an inverter between the first wordline $WL_{G,1}$ and the transistor M1; not shown in FIG. 5). The transistor M2 has a control terminal $N_{C2}$, a connection terminal $N_{N21}$ and a connection terminal $N_{N22}$, wherein the control terminal $N_{C2}$ is coupled to the control terminal $N_{C1}$, the connection terminal $N_{N21}$ is coupled to the connection terminal $N_{N12}$, and the connection terminal $N_{N22}$ is coupled to a reference voltage (implemented by a ground voltage GND in this embodiment). The inverter INV has a control terminal $N_{CV}$, an input terminal $N_{NV1}$ and an output terminal $N_{NV2}$, wherein the control terminal $N_{CV}$ is coupled to the second wordline $WL_{L1,1}$ to receive the second wordline signal $S_{LB,11}$, the input terminal $N_{NV1}$ is coupled to the connection terminal $N_{N12}$, and the output terminal $N_{NV2}$ is coupled to the third wordline $WL_{B1,1}$. The transistor M3 has a control terminal $N_{C3}$, a connection terminal $N_{N31}$ and a connection terminal $N_{N32}$, wherein the control terminal $N_{C3}$ is coupled to the second wordline $WL_{L1,1}$ to receive an inverting signal $S_{LB,11}'$ of the second wordline signal $S_{LB,11}$, the connection terminal $N_{N31}$ is coupled to the third wordline $WL_{B1,1}$, and the connection terminal $N_{N32}$ is coupled to a reference voltage (implemented by the ground voltage GND in this embodiment). Additionally, the transistor M1 may be implemented by a p-channel metal-oxide-semiconductor field effect transistor, and the transistor M2 may be implemented by an n-channel metal-oxide-semiconductor field effect transistor. However, this is not meant to be a limitation of the present invention.

In addition, the switch $SW_{1,1}$ may include a plurality of transistors M4 and M5. The transistor M4 has a control terminal $N_{C4}$, a connection terminal $N_{N41}$ and a connection terminal $N_{N42}$, wherein the control terminal $N_{C4}$ is coupled to the enable signal $S_{E,1}$, and the connection terminal $N_{N41}$ is coupled to the inverting signal $S_{GA,1}'$. The transistor M5 has a control terminal $N_{C5}$, a connection terminal $N_{N51}$ and a connection terminal $N_{N52}$, wherein the control terminal $N_{C5}$ is coupled to the enable signal $S_{E,1}$, the connection terminal $N_{N51}$ is coupled to a reference voltage (implemented by a supply voltage VDD in this embodiment), and the connection terminal $N_{N52}$ is coupled to the connection terminal $N_{N42}$. The transistor M4 may be implemented by an n-channel metal-oxide-semiconductor field effect transistor, and the transistor M5 may be implemented by a p-channel metal-oxide-semiconductor field effect transistor. However, this is not meant to be a limitation of the present invention.

In a case where the first wordline address $ADD_G$ shown in FIG. 3 indicates activating the first wordline $WL_{G,1}$ and the second wordline $ADD_{L,1}$ shown in FIG. 3 indicates activating the second wordline the switch $SW_{1,1}$ is turned on according to the enable signal $S_{E,1}$ (e.g. a high signal level) to couple the inverting signal $S_{GA,1}'$ to the connection node $N_{N11}$ of the transistor M1, and the transistor M1 turns on according to the inverting signal $S_{GA,1}'$ (e.g. a low voltage level) of the first wordline signal $S_{GA,1}$ so as to generate a control signal $S_{C,1}$ (e.g. a low voltage level). Next, the inverter INV may be enabled according to the second wordline signal $S_{LB,11}$, invert the control signal $S_{C,1}$ to generate a drive signal $S_{N,1}$ (e.g. a high voltage level) to the third wordline $WL_{B1,1}$, thereby activating the third wordline $WL_{B1,1}$. It should be noted that, as the control terminal $N_{C1}$ of the transistor M1 and the control terminal $N_{C2}$ of the transistor M2 are coupled to the third wordline $WL_{B1,1}$, the transistor M1 turns off, and the transistor M2 turns on to pull down a voltage at the terminal $N_{N21}$. In view of this, the inverter INV may continue inverting the voltage at the terminal $N_{N21}$ (staying low in response to the drive signal $S_{D,1}$) to activate the third wordline $WL_{B1,1}$. Hence, the third wordline $WL_{B1,1}$ may stay in an activation state rather than vary with a voltage level of the first wordline signal $S_{GA,1}$ (or the inverting $S_{GA,1}'$ thereof). Even though the first wordline address $ADD_G$ indicates activating another wordline different from the first wordline the wordline driver $LD_{1,1}$ may continue activating the third wordline $WL_{B1,1}$ for further processing such as charge sharing, data sensing and data write-back. Please note that the switch $SW_{1,1}$ may be turned off before address information indicated by the first wordline address $ADD_G$ changes. Thus, even if the first wordline address $ADD_G$ indicates activating the another wordline before the transistor M1 turns off, the wordline driver $LD_{1,1}$ may continue activating the third wordline $WL_{B1,1}$ without being affected by the changed address information indicated by the first wordline address $ADD_G$.

Figure 5:
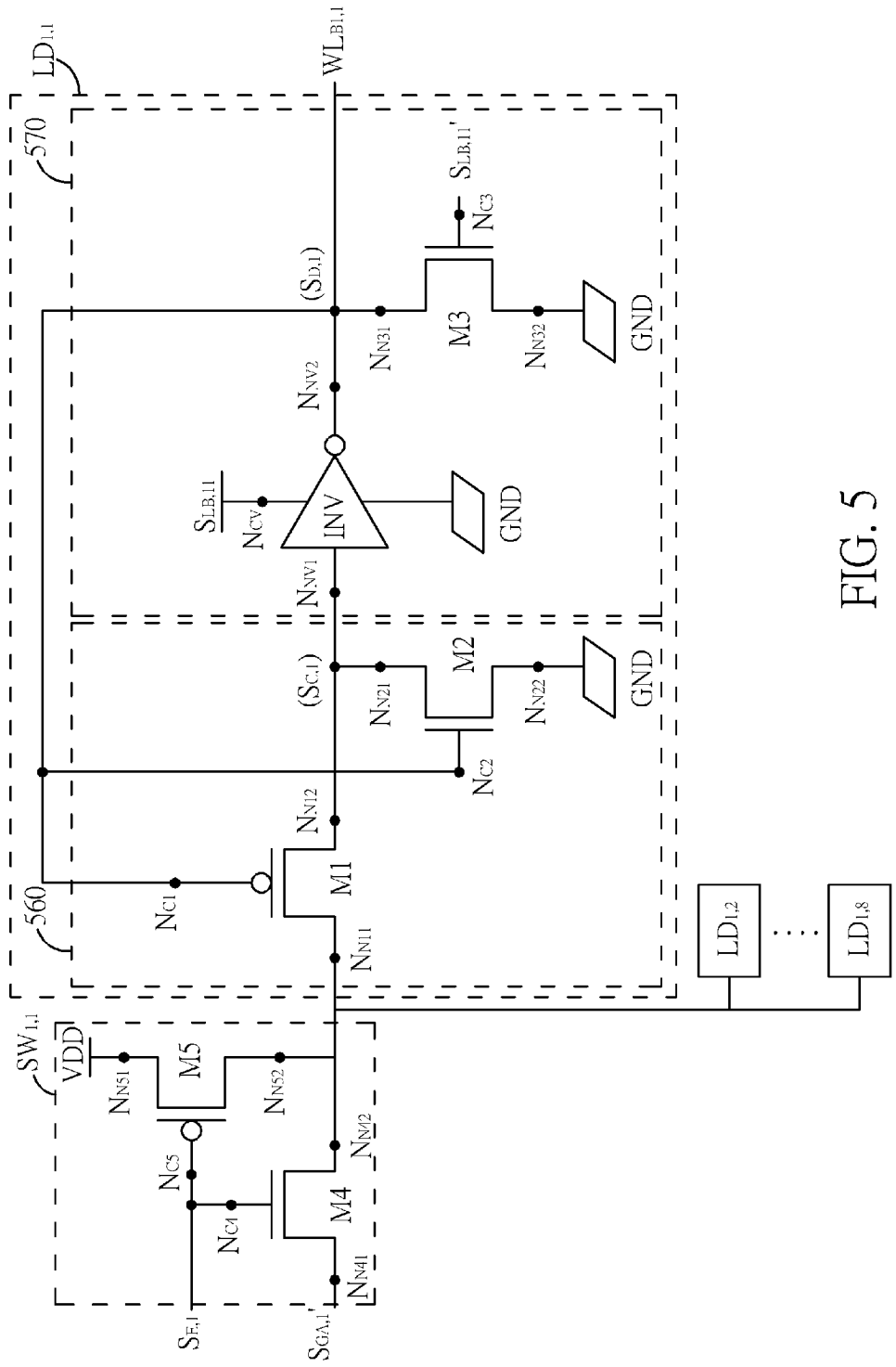
FIG. 5 is a diagram illustrating an implementation of the wordline driver shown in FIG. 4.

With the aid of the wordline driver architecture shown in FIG. 5, a plurality of memory banks operates independently of each. It should be noted that the wordline driver architecture shown in FIG. 5 employs only three transistors and an inverter to implement a latch-type wordline driver. Hence, a die area required for the proposed memory architecture does not increase with an increase in the number of memory banks, thus not only reducing costs but also shortening a transmission distance to improve signal quality.

The circuit topology of the wordline driver shown in FIG. 5 is for illustrative purposes only, and is not meant to be a limitation of the present invention. For example, the wordline driver $LD_{1,1}$ may be regarded to include a control device 560 and a drive device 570, wherein the control device 560 may be implemented by the transistors M1 and M2, and the drive device 570 may be implemented by the inverter INV and the transistor M3. The drive device 570 may generate the drive signal $S_{D,1}$ to the third wordline $WL_{B1,1}$ according to the control signal $S_{C,1}$ and the second wordline signal $S_{LB,11}$, and the control device 560 may generate the control signal $S_{C,1}$ according to the drive signal $S_{D,1}$ and the first wordline signal $S_{GA,1}$. Specifically, when the third wordline $WL_{B1,1}$ is deactivated (e.g. the drive signal $S_{D,1}$ corresponds to a low voltage level), the control device 560 may generate the control signal $S_{C,1}$ according to the drive signal $S_{D,1}$ and the first wordline signal $S_{GA,1}$ (i.e. the transistor M1 turns on), thereby activating the third wordline $WL_{B1,1}$. When the third wordline $WL_{B1,1}$ is in an activation state (e.g. after the third wordline $WL_{B1,1}$ is activated; the drive signal $S_{D,1}$ corresponds to a high voltage level), the control device 560 may generate the control signal $S_{C,1}$ according to the drive signal $S_{D,1}$ only (i.e. the transistor M1 turns off), thereby maintain the activation state of the third wordline $WL_{B1,1}$. In an alternative design, the control device 560 may employ another circuit topology different the circuit topology shown in FIG. 5 based on the aforementioned operations. In another alternative design, the drive device 570 may employ another circuit topology different the circuit topology shown in FIG. 5 based on the aforementioned operations. Further, the switch $SW_{1,1}$ may be implemented by other circuit topologies.

It should be noted that the proposed memory architecture may include a plurality of memory cell arrays, wherein each memory cell array may employ the memory architecture shown in FIG. 1/FIG. 2. Additionally, the number of wordline address bits, the number of memory banks, the number of memory sections and/or the number of wordlines shown in FIG. 2 is for illustrative purposes only, and is not meant to be a limitation of the present invention. Further, different memory banks may have different numbers of second wordlines.

Figure 6:
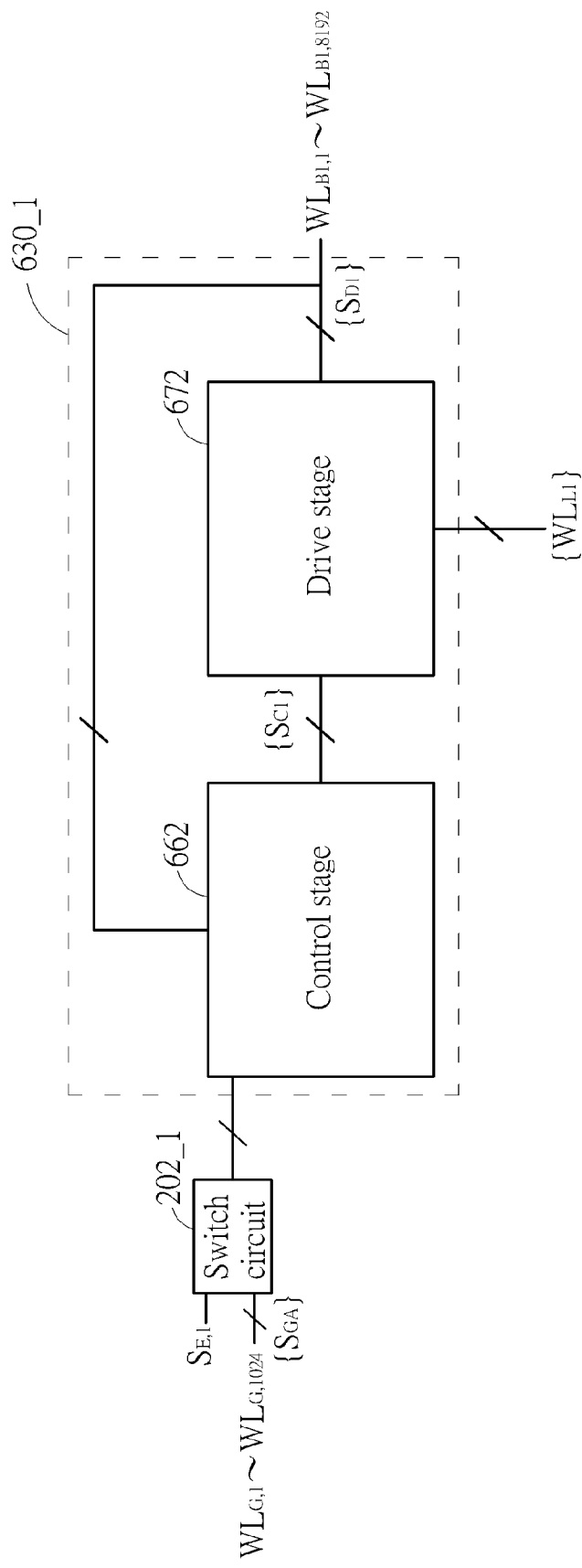
FIG. 6 is another implementation of the wordline drive circuit shown in FIG. 3.

The architecture of the control device and the drive device shown in FIG. 5 may be employed in a wordline drive circuit. Please refer to FIG. 6, which is another implementation of the wordline drive circuit 230_1 shown in FIG. 3. In this implementation, the wordline drive circuit 630_1 may include a control stage 662 and a drive stage 672. The drive stage 672 is coupled to the third wordlines $WL_{B1,1}$-$WL_{B1,8192}$ and the group of second wordlines $\{WL_{LA}\}$ coupled to the wordline drive circuit 630_1 (i.e. the second wordlines $WL_{L1,1}$-$WL_{L1,8}$). The drive stage 672 may be arranged for generating a set of drive signals $\{S_{D1}\}$ according to a set of control signals $\{S_{C1}\}$ and the set of second wordline signals $\{S_{LB,1}\}$ received by the wordline drive circuit 630_1, and accordingly driving the third wordlines $WL_{B1,1}$-$WL_{B1,8192}$. The control stage 662 is coupled to the drive stage 672 and the third wordlines $WL_{B1,1}$-$WL_{B1,8192}$, and is further coupled to the first wordlines $WL_{G,1}$-$WL_{G,1024}$ when the switch circuit 202_1 couples the first wordlines $WL_{G,1}$-$WL_{G,1024}$ to the memory bank 220_1 (or the wordline drive circuit 630_1). The control stage 662 may be arranged for generating the set of control signals $\{S_{C1}\}$ according to the set of drive signals $\{S_{D1}\}$ and the set of first wordline signals $\{S_{GA}\}$ received by the wordline drive circuit 630_1.

By way of example but not limitation, in a case where each wordline driver within the wordline drive circuit 230_1 shown in FIG. 4 is implemented by the control device 560 and the drive device 570 shown in FIG. 5, the control stage 662 may be implemented by control devices within the sets of wordline drivers $\{LD_1\}$-$\{LD_{1024}\}$, and the drive stage 672 may be implemented by drive devices within the sets of wordline drivers $\{LD_1\}$-$\{LD_{1024}\}$. As a person skilled in the art should understand operations of the wordline drive circuit 630_1 after reading the above paragraphs directed to FIG. 4 and FIG. 5, further description is omitted here for brevity.

Please note that the switch scheme shown in at least one of FIGS. 1-6 may be omitted. For example, referring again to FIG. 1, the switch circuits 102_1-102_M may be omitted. Hence, each of the memory banks 120_1-120_M is coupled to the first wordlines $WL_{G,1}$-$WL_{G,K}$, while the memory banks 120_1-120_M are coupled to the groups of second wordlines $\{WL_{L,1}\}$-$\{WL_{L,M}\}$ respectively. The memory banks 120_1-120_M may receive the shared set of first wordline signals $\{S_A\}$ through the first wordlines $WL_{G,1}$-$WL_{G,K}$, and receive the independent sets of second wordline signals $\{S_{LB,1}\}$-$\{S_{LB,M}\}$ through the groups of second wordlines $\{WL_{L,1}\}$-$\{WL_{L,M}\}$ respectively. Each memory bank performs a data access operation without referring a corresponding enable signal.

In another example, referring to FIGS. 2-4 again, the first wordline signals $S_{GA,1}$-$S_{GA,1024}$ included in the set of first wordline signals $\{S_{GA}\}$ may be directly transmitted to each of the wordline drive circuits 230_1-230_8 through the first wordlines $W_{LG,1}$-$W_{LG,1024}$ when the switch circuits 202_1-202_8 and the related enable signals $S_{E,1}$-$S_{E,8}$ are omitted. In yet another example, regarding the wordline driver $LD_{1,1}$ shown in FIG. 5, the connection terminal $N_{N11}$ may be directly to the first wordline $WL_{G,1}$ to receive an inverting signal $S_{GA,1}'$ when the switch $SW_{1,1}$ is omitted. In still another example, regarding the wordline drive circuit 630_1 shown in FIG. 6, the control stage 662 may be directly coupled to the first wordlines $WL_{G,1}$-$WL_{G,1024}$ when the switch circuit 202_1 is omitted.

To sum up, the proposed memory architecture may provide a plurality of memory banks (a single memory cell array can include a plurality of memory banks) and utilize a latch-type wordline drive circuit to realize seamless read/write operations, thereby achieving the objectives of high bandwidth data access and high speed random access.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory architecture, comprising:
K first wordlines, wherein K is a positive integer;
M groups of second wordlines, wherein M is a positive integer, and each of the M groups of second wordlines comprises a plurality of second wordlines; and
a memory cell array, comprising:
M memory banks, wherein each of the M memory banks comprises a plurality of memory cells arranged in rows and columns; each of the M memory banks is coupled to the K first wordlines, while the M memory banks are coupled to the M groups of second wordlines respectively; the M memory banks receive a shared set of first wordline signals through the K first wordlines, and receive independent M sets of second wordline signals through the M groups of second wordlines respectively; and each of the M memory banks performs a data access operation according to the received set of first wordline signals and a corresponding set of second wordline signals;
wherein each of the M memory banks further comprises:
a plurality of third wordlines, disposed in correspondence with the rows of the memory bank respectively; and
a wordline drive circuit, coupled to the K first wordlines, a group of second wordlines corresponding to the memory bank and the third wordlines, the wordline drive circuit arranged for enabling the third wordlines according to the received set of first wordline signals and a set of second wordline signals corresponding to the memory bank in order to access the memory cells of the memory bank;
wherein the group of second wordlines coupled to the wordline drive circuit comprises L second wordlines, L is a positive integer, and the wordline drive circuit comprises:
K sets of wordline drivers, coupled to the K first wordlines respectively, wherein one of the K sets of wordline drivers comprises:
L wordline drivers, wherein each of the L wordline drivers is coupled to a first wordline coupled to the set of wordline drivers; and the L wordline drives are coupled to the L second wordlines respectively, and are coupled to L of the third wordlines respectively;
wherein the set of first wordline signals received by the wordline drive circuit comprises K first wordline signals transmitted respectively through the K first wordlines; the set of second wordline signals received by the wordline drive circuit comprises L second wordline signals transmitted respectively through the L second wordlines; and each of the L wordline drivers comprises:
a drive device, coupled to a second wordline coupled to the wordline driver and coupled to a third wordline coupled to the wordline driver, the drive device arranged for generating a drive signal to the third wordline coupled to the wordline driver according to a control signal and a second wordline signal received by the wordline driver; and
a control device, coupled to the drive device, a first wordline coupled to the wordline driver, and the third wordline coupled to the wordline driver, the control device arranged for generating the control signal according to at least one of the drive signal and a first wordline signal received by the wordline driver.

2. The memory architecture of claim 1, further comprising:
M switch circuits, disposed in correspondence with the M memory banks respectively, wherein each of the M switch circuits selectively couples the K first wordlines to a corresponding memory bank so that the corresponding memory bank receives the shared set of first wordline signals through the K first wordlines.

3. The memory architecture of claim 1, wherein the wordline drive circuit is a latch-type drive circuit.

4. The memory architecture of claim 1, wherein a portion of the L wordline drivers are disposed on one side of the memory bank in a column direction, and another portion of the L wordline drivers are disposed on another side of the memory bank in the column direction.

5. The memory architecture of claim 1, wherein when the third wordline coupled to the wordline driver is activated, the control device generates the control signal according to the drive signal only.

6. The memory architecture of claim 1, wherein when the third wordline coupled to the wordline driver is deactivated, the control device generates the control signal according to the drive signal and the first wordline signal received by the wordline driver.

7. The memory architecture of claim 1, wherein the drive device comprises:
an inverter, having a control terminal, an input terminal and an output terminal, wherein the control terminal of the inverter is coupled to the second wordline coupled to the wordline driver so as to receive the corresponding second wordline signal, the input terminal of the inverter is coupled to the control device, and the output terminal of the inverter is coupled to the third wordline coupled to the wordline driver; and
a transistor, having a control terminal, a first connection terminal and a second connection terminal, wherein the control terminal of the transistor is coupled to the second wordline coupled to the wordline driver so as to receive an inverting signal of the corresponding second wordline signal, the first connection terminal of the transistor is coupled to the third wordline coupled to the wordline driver, and the second connection terminal of the transistor is coupled to a reference voltage.

8. The memory architecture of claim 1, wherein the control device comprises:
a first transistor, having a control terminal, a first connection terminal and a second connection terminal, wherein the control terminal of the first transistor is coupled to the third wordline coupled to the wordline driver, the first connection terminal of the first transistor is coupled to the first wordline coupled to the wordline driver so as to receive an inverting signal of the corresponding first wordline signal, and the second connection terminal of the first transistor is coupled to the drive device; and
a second transistor, having a control terminal, a first connection terminal and a second connection terminal, wherein the control terminal of the second transistor is coupled to the control terminal of the first transistor, the first connection terminal of the second transistor is coupled to the second connection terminal of the first transistor, and the second connection terminal of the second transistor is coupled to a reference voltage.

9. The memory architecture of claim 8, wherein the first transistor is a p-channel metal-oxide-semiconductor field effect transistor, and the second transistor is an n-channel metal-oxide-semiconductor field effect transistor.

10. The memory architecture of claim 1, further comprising:
M switch circuits, disposed in correspondence with the M memory banks respectively, wherein each of the M switch circuits selectively couples the K first wordlines to a corresponding memory bank so that the corresponding memory bank receives the shared set of first wordline signals through the K first wordlines; and at least one of the switch circuits selectively couples the K first wordlines to the K sets of wordline drivers respectively, and comprises:
K switches, disposed in correspondence with the K first wordlines respectively, wherein each of the K switches selectively couples a first wordline to a corresponding set of wordline drivers.

11. The memory architecture of claim 1, wherein each group of second wordlines has the same number of wordlines.

12. The memory architecture of claim 1, further comprising:
a first decoding circuit, coupled to the M memory banks through the K first wordlines, the first decoding circuit arranged for decoding a first wordline address to generate the set of first wordline signals; and
M second decoding circuits, coupled to the M memory banks through the M groups of second wordlines respectively, wherein each of the M second decoding circuits is arranged for decoding a second wordline address to generate a set of second wordline signals received by a corresponding memory bank coupled to the second decoding circuit.

13. A memory architecture, comprising:
K first wordlines, wherein K is a positive integer;
M groups of second wordlines, wherein M is a positive integer, and each of the M groups of second wordlines comprises a plurality of second wordlines; and
a memory cell array, comprising:
M memory banks, wherein each of the M memory banks comprises a plurality of memory cells arranged in rows and columns; each of the M memory banks is coupled to the K first wordlines, while the M memory banks are coupled to the M groups of second wordlines respectively; the M memory banks receive a shared set of first wordline signals through the K first wordlines, and receive independent M sets of second wordline signals through the M groups of second wordlines respectively; and each of the M memory banks performs a data access operation according to the received set of first wordline signals and a corresponding set of second wordline signals;
wherein each of the M memory banks further comprises:
a plurality of third wordlines, disposed in correspondence with the rows of the memory bank respectively; and
a wordline drive circuit, coupled to the K first wordlines, a group of second wordlines corresponding to the memory bank and the third wordlines, the wordline drive circuit arranged for enabling the third wordlines according to the received set of first wordline signals and a set of second wordline signals corresponding to the memory bank in order to access the memory cells of the memory bank, wherein the wordline drive circuit comprises:
- a drive stage, coupled to the third wordlines and the group of second wordlines coupled to the wordline drive circuit, the drive stage arranged for generating a set of drive signals according to a set of control signals and the set of second wordline signals received by the wordline drive circuit, and accordingly driving the third wordlines; and
- a control stage, coupled to the drive stage, the K first wordlines and the third wordlines, wherein the control stage is arranged for generating the set of control signals according to the set of drive signals and the set of first wordline signals received by the wordline drive circuit.

14. The memory architecture of claim 13, further comprising:
M switch circuits, disposed in correspondence with the M memory banks respectively, wherein each of the M switch circuits selectively couples the K first wordlines to a corresponding memory bank so that the corresponding memory bank receives the shared set of first wordline signals through the K first wordlines.

15. The memory architecture of claim 13, wherein the wordline drive circuit is a latch-type drive circuit.

16. The memory architecture of claim 13, wherein the group of second wordlines coupled to the wordline drive circuit comprises L second wordlines, L is a positive integer; the drive stage comprises K sets of drive devices and K sets of control devices; the K sets of drive devices are coupled to the K sets of control devices respectively; and one of the K sets of drive devices comprises:
- L drive devices, wherein the L drive devices are coupled to the L second wordlines respectively, and are coupled to L of the third wordlines respectively;

wherein one of the K sets of control devices coupled to the set of drive devices comprises:
- L control devices, coupled to the L drive devices respectively, wherein each of the L control devices is coupled to a first wordline coupled to the set of drive devices, and is coupled to the third wordline coupled to the drive device.

17. The memory architecture of claim 16, wherein the set of first wordline signals received by the wordline drive circuit comprises K first wordline signals transmitted respectively through the K first wordlines; the set of second wordline signals received by the wordline drive circuit comprises L second wordline signals transmitted respectively through the L second wordlines; and each of the L drive devices comprises:
- a drive device, coupled to a second wordline of the L second wordlines and coupled to a third wordline of the L second wordlines, the drive device arranged for generating a drive signal of the set of drive signals to a third wordline coupled to the drive device according to a control signal of the set of control signals and a second wordline signal of the set of second wordline signals;
- wherein a control device coupled to the drive device is coupled to the first wordline coupled to the set of drive devices, and is coupled to the third wordline coupled to the drive device; the control device receives a first wordline signal through the first wordline coupled to the set of drive devices, and generates the control signal according to at least one of the drive signal and the first wordline signal.

18. The memory architecture of claim 16, further comprising:
M switch circuits, disposed in correspondence with the M memory banks respectively, wherein each of the M switch circuits selectively couples the K first wordlines to a corresponding memory bank so that the corresponding memory bank receives the shared set of first wordline signals through the K first wordlines; and at least one of the switch circuits selectively couples the K first wordlines to the K sets of wordline drivers respectively, and comprises:
- K switches, disposed in correspondence with the K first wordlines respectively, wherein each of the K switches selectively couples a first wordline to a corresponding one of the K sets of control devices.

19. The memory architecture of claim 13, further comprising:
- a first decoding circuit, coupled to the M memory banks through the K first wordlines, the first decoding circuit arranged for decoding a first wordline address to generate the set of first wordline signals; and
- M second decoding circuits, coupled to the M memory banks through the M groups of second wordlines respectively, wherein each of the M second decoding circuits is arranged for decoding a second wordline address to generate a set of second wordline signals received by a corresponding memory bank coupled to the second decoding circuit.

* * * * *